(12) United States Patent
Cho et al.

(10) Patent No.: US 7,326,621 B2
(45) Date of Patent: Feb. 5, 2008

(54) METHOD OF FABRICATING A RECESS CHANNEL ARRAY TRANSISTOR USING A MASK LAYER WITH A HIGH ETCH SELECTIVITY WITH RESPECT TO A SILICON SUBSTRATE

(75) Inventors: Young-sun Cho, Gyeonggi-do (KR); Tae-hyuk Ahn, Gyeonggi-do (KR); Jeong-sic Jeon, Gyeonggi-do (KR); Jun-sik Hong, Gyeonggi-do (KR); Ji-hong Kim, Seoul (KR); Hong-Mi Park, Seoul (KR)

(73) Assignee: Samsug Electronics Co., Ltd., Suwon-si, Gyeonggi-do (KR)

( * ) Notice: Subject to any disclaimer, the term of this patent is extended or adjusted under 35 U.S.C. 154(b) by 309 days.

(21) Appl. No.: 11/015,366

(22) Filed: Dec. 16, 2004

(65) Prior Publication Data

US 2005/0136616 A1    Jun. 23, 2005

(30) Foreign Application Priority Data

Dec. 19, 2003   (KR) .................. 10-2003-0093682

(51) Int. Cl.
*H01L 21/336*    (2006.01)
(52) U.S. Cl. .................. 438/296; 438/425; 257/E21.2; 257/E21.205; 257/E21.426; 257/E21.629; 257/E29.135
(58) Field of Classification Search ............ 438/296, 438/425; 257/E21.2, E21.205, E21.429, 257/E21.629, E29.135
See application file for complete search history.

(56) References Cited

U.S. PATENT DOCUMENTS 5,945,707 A * 8/1999 Bronner et al. ............ 257/330
6,284,605 B1 * 9/2001 Kim et al. .................. 438/268

(Continued)

FOREIGN PATENT DOCUMENTS

JP          7-131000         5/1995

(Continued)

OTHER PUBLICATIONS

English language abstract of Japanese Publication No. 2003-174158.
English language abstract of Japanese Publication No. 7-131000.

*Primary Examiner*—Fernando L. Toledo
*Assistant Examiner*—Jarrett J Stark
(74) *Attorney, Agent, or Firm*—Marger Johnson & McCollom, P.C.

(57) ABSTRACT

A method of fabricating a recess channel array transistor. Using a mask layer pattern having a high etch selectivity with respect to a silicon substrate, the silicon substrate and an isolation insulating layer are etched to form a recess channel trench. After forming a gate insulating layer and a recess gate stack on the recess channel trench, a source and a drain are formed in the silicon substrate adjacent to both sidewalls of the recess gate stack, thereby completing the recess channel array transistor. Because the mask layer pattern having the high etch selectivity with respect to the silicon substrate is used, a depth of the recess channel trench is easily controlled while good etching uniformity of the silicon substrate is obtained.

24 Claims, 14 Drawing Sheets

U.S. PATENT DOCUMENTS

| | | |
|---|---|---|
| 6,284,606 B1 | 9/2001 | Samudra et al. |
| 7,205,199 B2 * | 4/2007 | Park et al. .................. 438/270 |
| 2002/0196651 A1 * | 12/2002 | Weis .......................... 365/100 |
| 2005/0077568 A1 * | 4/2005 | Park et al. .................. 257/330 |
| 2005/0087832 A1 * | 4/2005 | Park .......................... 257/506 |
| 2005/0095794 A1 * | 5/2005 | Park .......................... 438/296 |
| 2005/0250284 A1 * | 11/2005 | Park .......................... 438/270 |
| 2005/0266648 A1 * | 12/2005 | Chung et al. ............... 438/296 |
| 2006/0113590 A1 * | 6/2006 | Kim et al. ................... 257/330 |

FOREIGN PATENT DOCUMENTS

| | | |
|---|---|---|
| JP | 2003-174158 | 6/2003 |
| KR | 2005052643 A * | 6/2005 |

\* cited by examiner

METHOD OF FABRICATING A RECESS CHANNEL ARRAY TRANSISTOR USING A MASK LAYER WITH A HIGH ETCH SELECTIVITY WITH RESPECT TO A SILICON SUBSTRATE

BACKGROUND OF THE INVENTION

This application claims the priority of Korean Patent Application No. 2003-93682, filed on Dec. 19, 2003, in the Korean Intellectual Property Office, the disclosure of which is incorporated herein in its entirety by reference.

1. Field of the Invention

The present invention relates to a method of fabricating a transistor semiconductor device, and more particularly to a method of fabricating a recess channel array transistor.

2. Description of the Related Art

Increased integration densities and decreased design rules of integrated semiconductor devices place challenges on the stable operation of transistors. For example, a decreased design rule of an integrated circuit device results in a decrease of a gate width, so that a channel of a transistor is significantly shortened. Accordingly, a so-called short channel effect frequently occurs.

A short channel induces punchthrough between a source and a drain of a transistor. Such punchthrough is regarded as a major cause of malfunctions in the transistor device. In order to overcome the short channel effect, methods are being researched to secure longer channel lengths regardless of the design rule. In particular, considerable efforts are being made to form a recess channel array transistor in which a silicon substrate is recessed under a gate, thereby extending the channel length.

FIGS. 1 through 5 are cross-sectional views illustrating a conventional method of fabricating a recess channel array transistor.

Referring to FIG. 1, an isolation insulating layer 104 that fills a trench 102 of a silicon substrate 100 is formed to define an active region AR. The isolation insulating layer 104 is an oxide layer. The isolation insulating layer 104 is a field region FR. A liner layer 103 is formed along an inner wall of the trench 102, thereby shielding the isolation insulating layer 104. The liner layer 103 is a nitride layer.

A buffer insulating layer 106 is formed on the silicon substrate 100 and the isolation insulating layer 104. The buffer insulating layer 106 is an oxide layer having a thickness of 100 to 200 Å. Then, a polysilicon mask layer 108 is formed on the buffer insulating layer 106 to a thickness of 1000 Å.

Referring to FIG. 2, an organic anti-reflective coating layer 110 is formed on the polysilicon mask layer 108 to a thickness of 800 Å. The organic anti-reflective coating layer 110 prevents reflection of light from the polysilicon mask layer 108 during exposure for forming a photoresist pattern in a subsequent process. A photoresist pattern 112 is formed on the organic anti-reflective coating layer 110 using a photolithography process.

Referring to FIG. 3, using the photoresist pattern 112 as an etch mask, the organic anti-reflective coating layer 110, the polysilicon mask layer 108 and the buffer insulating layer 106 are etched, thereby sequentially forming an organic anti-reflective coating layer pattern 110a, a polysilicon mask layer pattern 108a and a buffer insulating layer pattern 106a. The organic anti-reflective coating layer 110, the polysilicon mask layer 108 and the buffer insulating layer 106 are plasma etched using HBr and $Cl_2$ gas by means of polysilicon etching equipment. A surface of the silicon substrate 100 is partially exposed through the organic anti-reflective coating layer pattern 110a, the polysilicon mask layer pattern 108a and the buffer insulating layer pattern 106a. A recess channel trench is subsequently formed in the exposed portion of the silicon substrate 100 in a subsequent process.

Referring to FIG. 4, the photoresist pattern 112a and the organic anti-reflective coating layer pattern 110a used as etch masks are sequentially removed. Thus, the buffer insulating layer pattern 106a and the polysilicon mask layer pattern 108a remain on the silicon substrate 100.

Referring to FIGS. 4 and 5, the silicon substrate 100 and the isolation insulating layer 104 are plasma etched using the polysilicon mask layer pattern 108a and the buffer insulating layer pattern 106a as an etch mask, thereby forming recess channel trenches 114 and 116. The plasma etching is performed by means of polysilicon etching equipment using a gas containing Ar, $CF_4$, $Cl_2$ and $O_2$.

The recess channel trenches 114 and 116 can be etched in two steps. First, the silicon substrate 100 is etched while etching the polysilicon mask layer pattern 108a. Secondly, over-etching is performed.

Because the polysilicon mask layer pattern 108a and the silicon substrate 100 have similar etch rates, the silicon substrate 100 is etched as deep as the height of the polysilicon mask layer pattern 108a, thereby determining a depth H1 of the recess channel trench 116. In other words, the depth H1 of the recess channel trench 116 depends on the height of the polysilicon mask layer pattern 108a.

On the other hand, the etch selectivity of the polysilicon mask layer pattern 108a with respect to the isolation insulating layer 104 is high. Therefore, the depth H2 of the recess channel trench 114 formed in the isolation insulating layer 104 is shallower than a depth H1 of the recess channel trench 116 formed in the silicon substrate 100. Thereafter, a gate oxide layer (not shown) and a recess gate stack (not shown) are formed within the recess channel trenches 114 and 116, thereby completing the recess channel array transistor.

The conventional method of fabricating the recess channel array transistor including the processing step shown in FIG. 3 is disadvantageous in that the buffer insulating layer 106 cannot be effectively etched because the polysilicon mask layer 108 is etched using polysilicon layer etching equipment. That is, since the HBr and $Cl_2$ gases used when etching the polysilicon mask layer 108 have a high etch selectivity with respect to an oxide layer, by-products generated during the etching adhere to the buffer insulating layer 106 and undesirably generate oxide etch residues when the buffer insulating layer 106 is exposed after etching the polysilicon mask layer 108. These residues deteriorate the profiles and the uniformity of the depths of the recess channel trenches.

Moreover, in the prior art, it has been difficult to adjust the depths of the recess channel trenches and to secure uniformity when etching the silicon substrate during the process of forming the recess channel trenches described with reference to FIGS. 4 and 5. To further illustrate these difficulties, the processing steps of forming the recess channel trenches formed in the silicon substrate 100 will be described with reference to FIGS. 6, 7 and 8. FIGS. 6, 7 and 8 are perspective views illustrating the processing steps for forming the recess channel trenches shown in FIGS. 4 and 5. Like reference numerals in FIGS. 6 through 8 and FIGS. 4 and 5 denote like elements.

Referring to FIG. 6, the buffer insulating layer pattern 106a and the polysilicon mask layer pattern 108a are formed on the silicon substrate 100. The silicon substrate 100 is exposed by the buffer insulating layer pattern 106a and the polysilicon mask layer pattern 108a. The exposed portion of the silicon substrate 100 will have the recess channel trench 116 formed therein. Generally, the portion where the recess channel trench 116 is formed is a narrow region NR, e.g., a cell region, of the silicon substrate 100, and the other portion where the recess channel trench is not formed is a wide region WR.

FIG. 7 shows the recess channel trench 116 partially completed. Using the polysilicon mask layer pattern 108a and the buffer insulating layer pattern 106a as an etch mask, the silicon substrate 100 is etched to form the recess channel trench 116 in the narrow region NR. As shown in FIG. 7, a depth of the recess channel trench 116 corresponds to the height of an etched portion 120 of the polysilicon mask layer pattern 108a. In FIG. 7, arrows denote an etching orientation.

FIG. 8 shows the formation of the recess channel trench 116 that is completed. Using the polysilicon mask layer pattern 108a and the buffer insulating layer pattern 106a as an etch mask, the recess channel trench 116 is formed by etching the silicon substrate 100 in the narrow region NR. The depth of the recess trench 116 corresponds to the height of an etched portion 122 of the polysilicon mask layer pattern 108a.

However, because the recess channel trench 116 shown in FIG. 8 is formed in the narrow region (cell region) only, the ambient within an etching chamber varies if the buffer insulating layer pattern 106a of the wide region is exposed after thoroughly etching the polysilicon mask layer pattern 108a. Thus, the plasma etching gas can be concentrated on the recess channel trench 116 formed in the narrow region NR, as denoted by the arrows in FIG. 8, making it difficult to adjust the depth of the recess channel trench 116 and to secure etching uniformity of the silicon substrate 100.

Accordingly, there is a need for a method of fabricating a recess channel array transistor in which a depth of a recess channel trench can be easily controlled and good etching uniformity of a silicon substrate can be obtained.

SUMMARY OF THE INVENTION

According to an aspect of the invention, there is provided a method of fabricating a recess channel array transistor, in which a buffer insulating layer is formed on a silicon substrate and an isolation insulating layer. Also, a mask layer having a high etch selectivity with respect to the silicon substrate is formed. The mask layer may be a silicon nitride layer, e.g., an SiON layer or an $Si_XN_Y$ layer.

Subsequently, the mask layer and the buffer insulating layer are selectively etched, thereby forming a mask layer pattern and a buffer insulating layer pattern that expose a portion of the active region and a portion of the isolation insulating layer. The exposed portions of the silicon substrate and the isolation insulating layer are etched to form a recess channel trench.

When forming the recess channel trench, the etch selectivity of the mask layer pattern with respect to the silicon substrate may be about 3:1. When the recess channel trench is formed, a portion of the mask layer pattern remains because of the high etch selectivity with respect to the silicon substrate. The remaining mask layer pattern inhibits variations of the ambient in an etching chamber caused by forming the recess channel trench. Therefore, a depth of the recess channel trench can be easily controlled, and good etching uniformity of the silicon substrate can be obtained.

Thereafter, the remaining mask layer pattern is removed. Silicon fences formed on sidewalls of the trench are removed while removing the remaining mask layer pattern. The remaining mask layer pattern and the silicon fences are simultaneously removed via chemical dry etching or wet etching. Accordingly, an additional process is not required.

Then, after forming a gate insulating layer and a recess gate stack on the recess channel trench, a source and a drain are formed in the silicon substrate adjacent to both sidewalls of the recess gate stack, thereby completing the formation of the recess channel array transistor.

BRIEF DESCRIPTION OF THE DRAWINGS

The above and other features and advantages of the present invention will become more apparent by describing in detail exemplary embodiments thereof with reference to the attached drawings in which:

FIGS. 10A and 10B through 14A and 14B are cross-sectional views illustrating a method of fabricating a recess array channel transistor according to a first embodiment of the present invention;

DETAILED DESCRIPTION OF THE PREFERRED EMBODIMENTS

Figure 1:
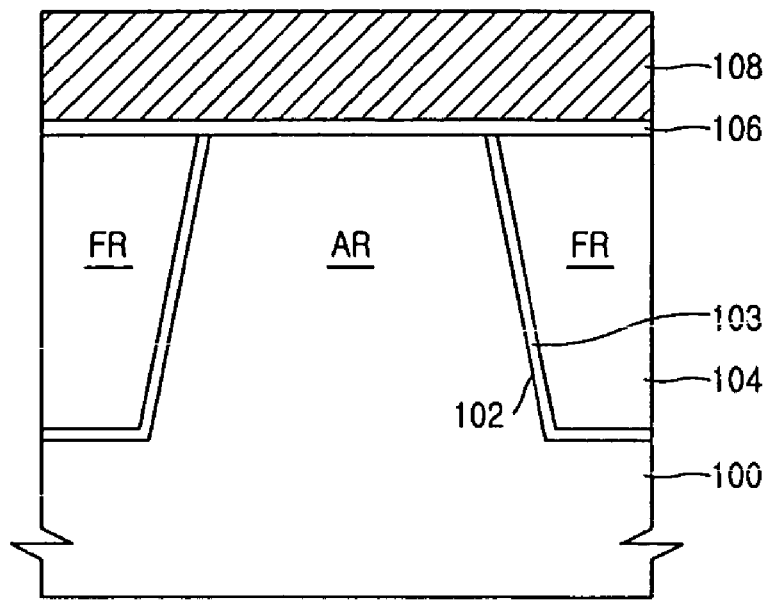
FIGS. 1 through 5 are cross-sectional views illustrating a conventional method of fabricating a recess channel array transistor.
Figure 2:
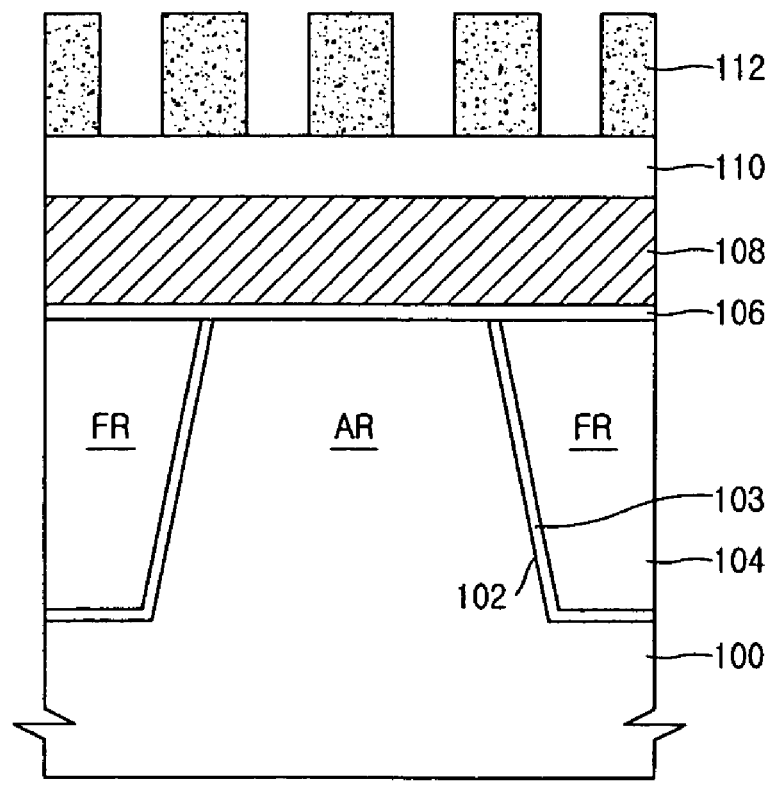
Figure 3:
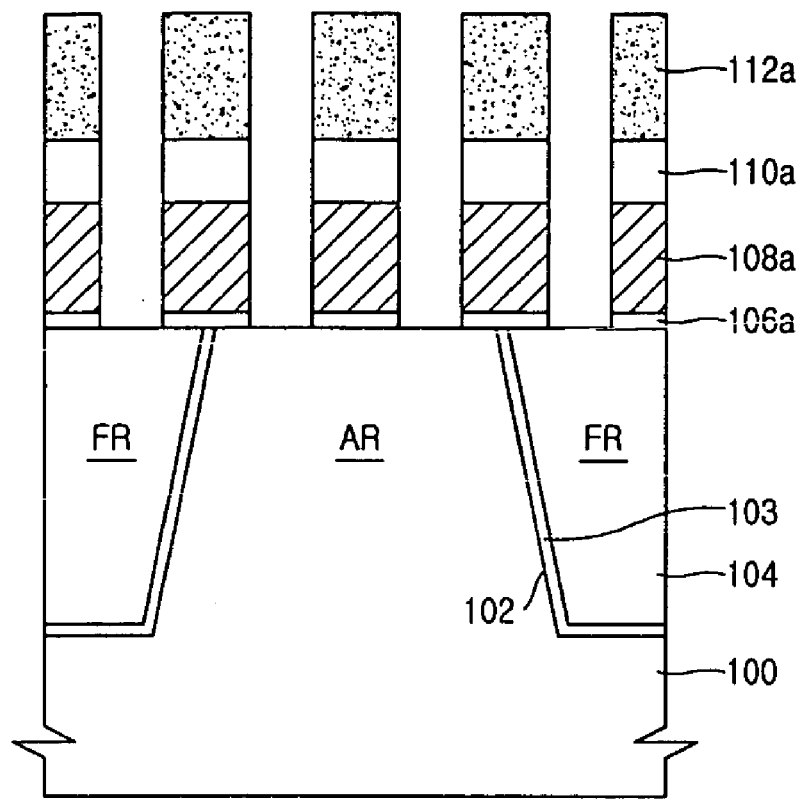
Figure 4:
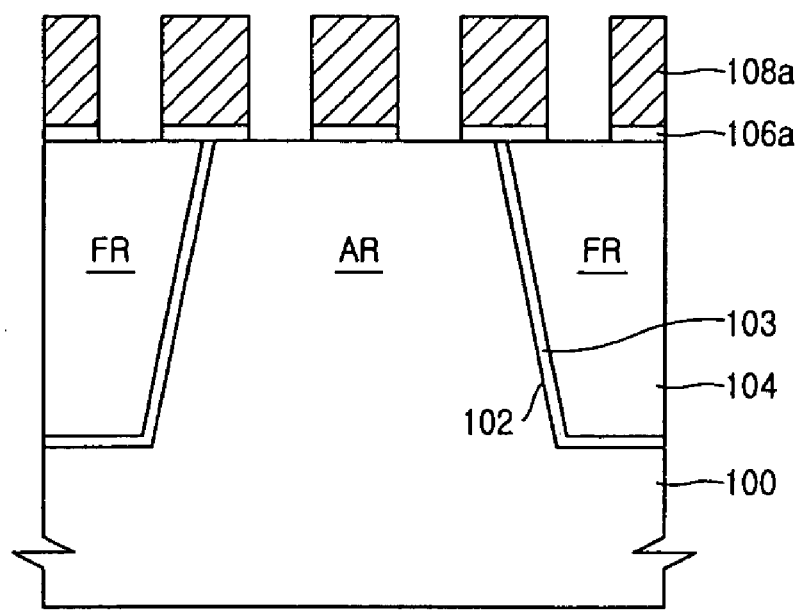
Figure 5:
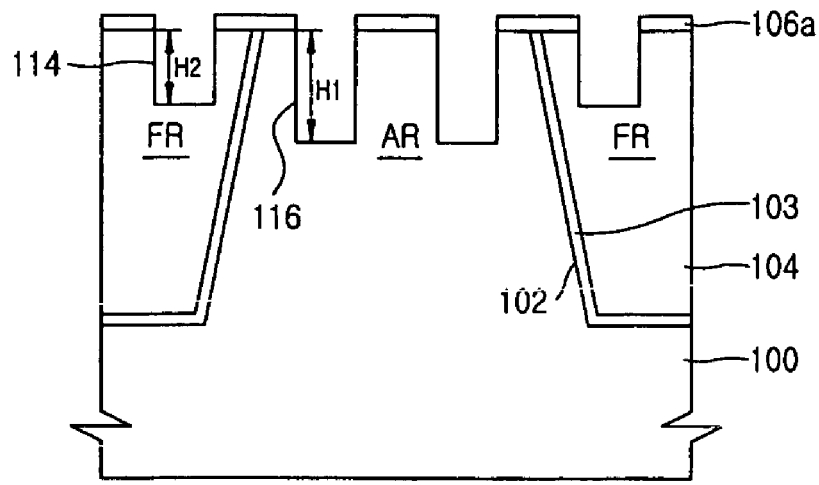
Figure 6:
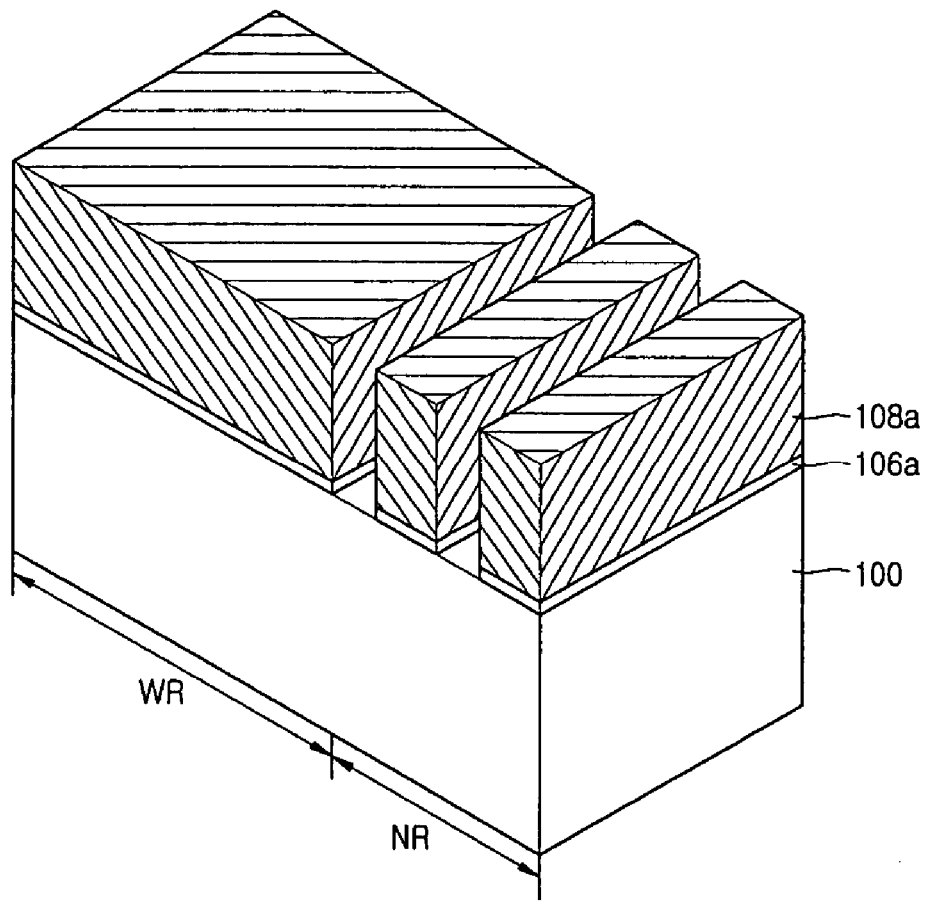
FIGS. 6 through 8 are perspective views illustrating an operation of forming a recess channel trench shown in FIGS. 4 and 5.
Figure 7:
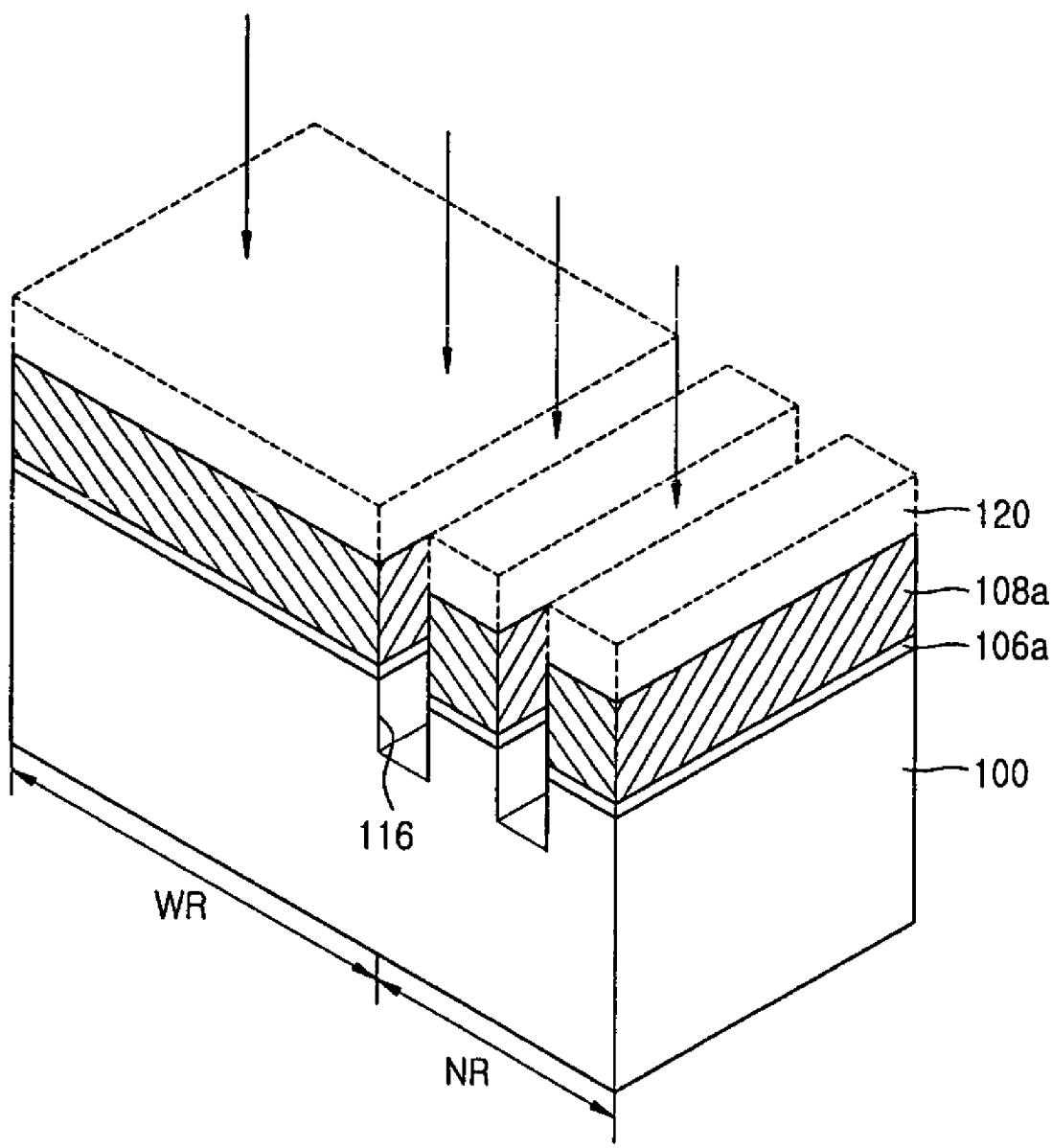
Figure 8:
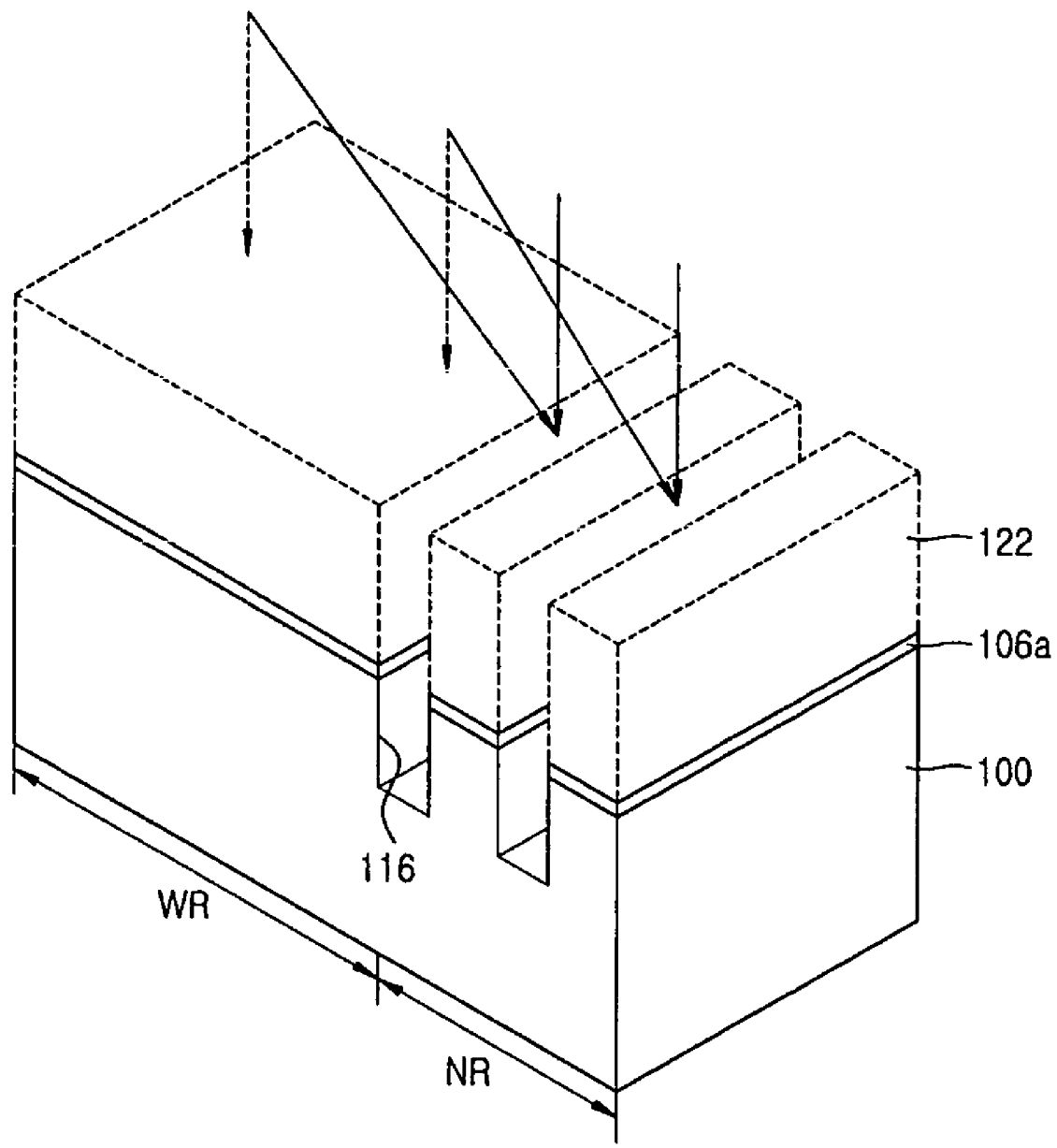

The invention will now be described more fully with reference to the accompanying drawings. The invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the thicknesses of layers and regions are exaggerated for clarity.

Figure 9:
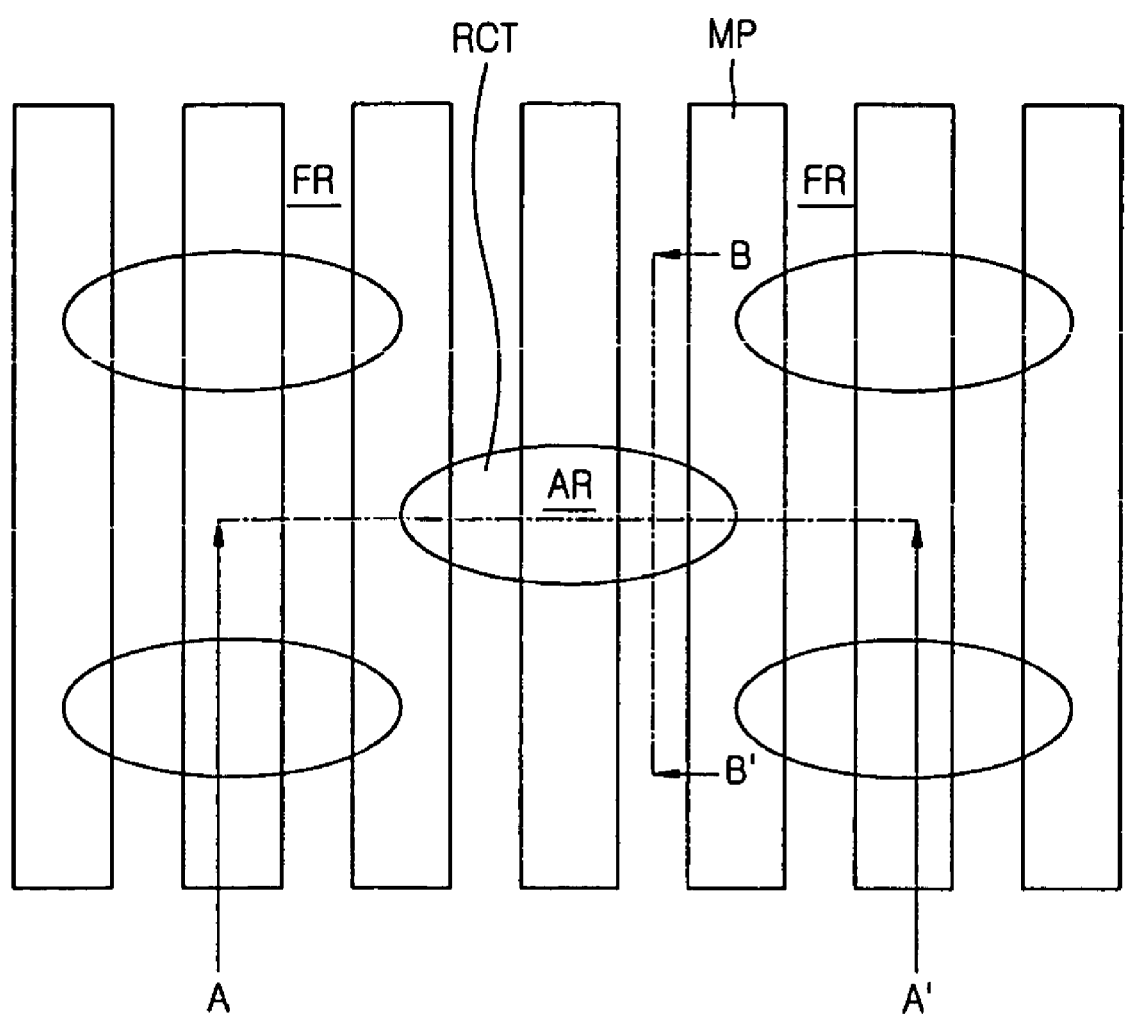
FIG. 9 illustrates a layout of a mask layer pattern applied to a method of fabricating a recess array channel transistor according to an embodiment of the present invention.

FIG. 9 illustrates a layout of a mask layer pattern used to a method of fabricating a recess channel array transistor according to an aspect of the present invention.

Referring to FIG. 9, an active region AR for forming a recess channel array transistor is defined on a silicon substrate 200 (FIG. 10). A region outside the active region AR is a field region FR, formed with a trench insulating layer. A mask layer pattern MP formed in a straight line pattern crosses the active region AR and the field region FR. A recess channel trench RCT is formed in the active region AR.

FIGS. 10 through 14 are cross-sectional views illustrating a method of fabricating the recess array channel trench according to an embodiment of the invention. FIGS. 10A, 11A, 12A, 13A, and 14A are cross-sectional views taken along line A-A' of FIG. 9. FIGS. 10B, 11B, 12B, 13B, and 14B are cross-sectional views taken along line B-B' of FIG. 9.

Figure 10A:
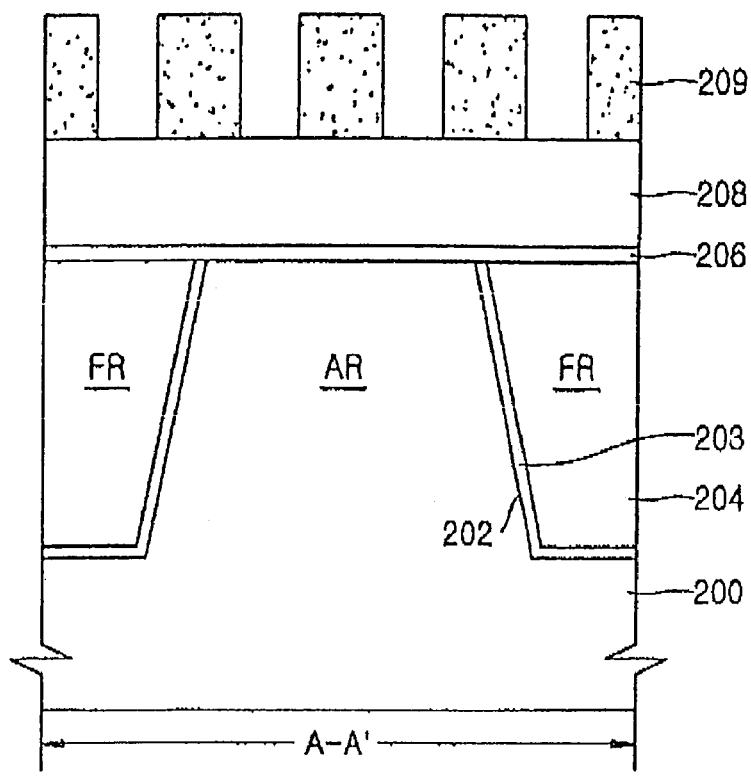
Figure 10B:
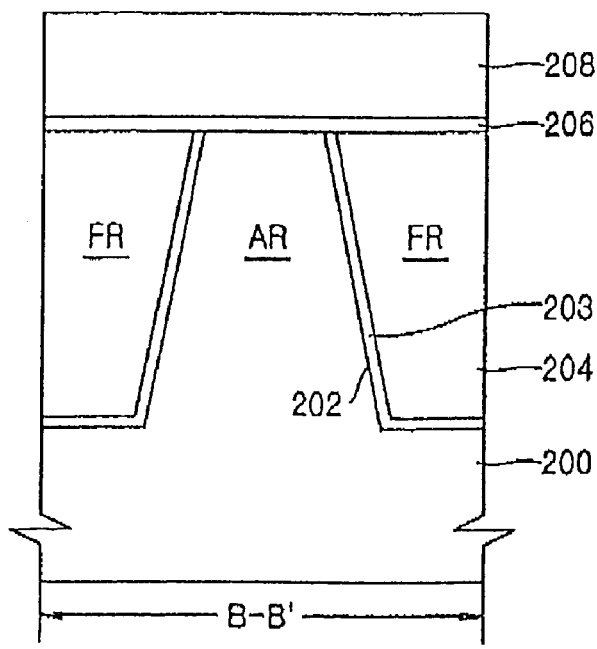

Referring to FIGS. 10A and 10B, a portion of a silicon substrate 200 is selectively etched, thereby forming a trench 202. A liner layer 203 formed of an insulating material such as nitride is disposed along an inner wall of the trench 202. The liner layer 203 alleviates silicon substrate damage that occurs when etching the recess array channel trench and shields an isolation insulating layer 204.

The isolation insulating layer 204 is formed in the trench 202, thereby defining a field region FR and an active region AR. The region where the isolation insulating layer 204 is formed is the field region FR.

A buffer insulating layer 206 is formed on the silicon substrate 200 and the isolation insulating layer 204. The buffer insulating layer 206 has a thickness of about 100 to 200 Å. The buffer insulating layer 206 is an oxide layer disposed on the active region AR and the isolation insulating layer 204 of the silicon substrate 200.

A mask layer 208 is formed on the buffer insulating layer 206. The mask layer 208 is composed of a material layer with a high etch selectivity with respect to the silicon substrate 200. The mask layer 208 has a thickness of about 400 to 600 Å. The mask layer 208 is a silicon nitride layer, e.g., a SiON layer or a $Si_xN_y$ layer, of which etch selectivity ratio with respect to the silicon substrate 200 is about 3:1. However, the present invention is not limited to this specific etch selectivity ratio. Other selectivity ratios may be used for implementing the present invention as long as it is within the spirit and scope of the present invention.

A photoresist pattern 209 used for forming the recess channel trench in a subsequent process is formed on the mask layer 208 using conventional photolithography and etching processes. Because the mask layer 208 may be used as an anti-reflective layer during photolithography for forming the recess channel trench, an organic anti-reflective layer is not required, thereby simplifying the overall fabrication process.

Figure 11A:
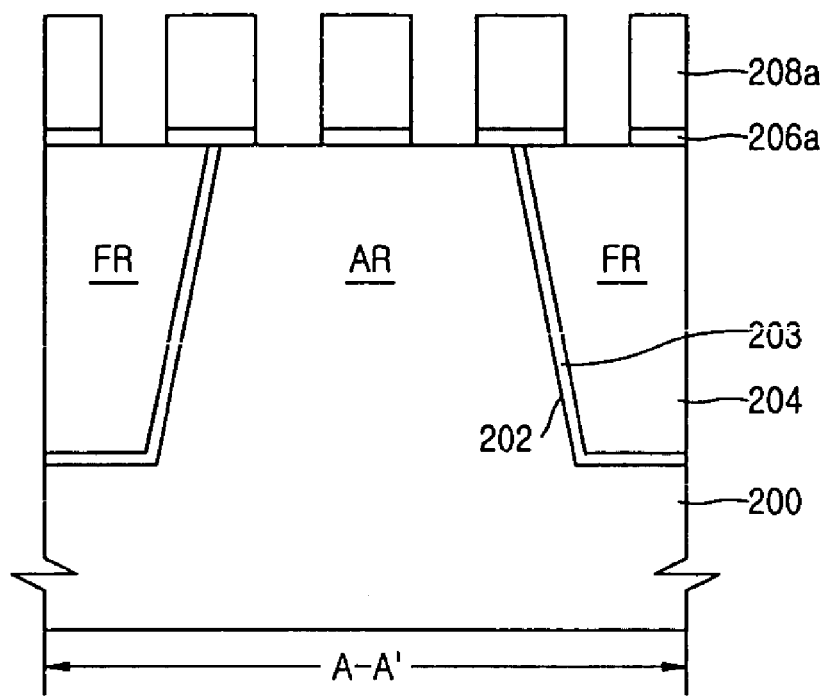
Figure 11B:
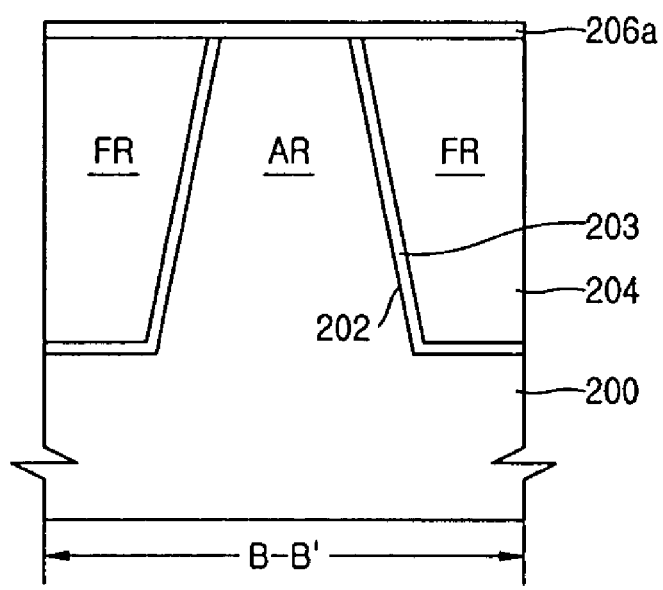

Referring to FIGS. 11A and 11B, a mask layer pattern 208a and a buffer insulating layer pattern 206a may be formed by one of the following two methods.

First, the mask layer 208 and the buffer insulating layer 206 are sequentially etched using the photoresist pattern 209 as an etch mask, thereby forming the mask layer pattern 208a and the buffer insulating layer pattern 206a. Then, the photoresist pattern 209 used as the etch mask is removed. In this case, the mask layer 208 and the buffer insulating layer 206 are plasma etched by nitride layer etching equipment using, for example, F and Cl gases.

Alternatively, second, the mask layer 208 is selectively etched using the photoresist pattern 209 as a mask, thereby forming the mask layer pattern 208a. In this case, the mask layer 208 is plasma etched by nitride layer etching equipment using, for example, F and Cl gases. Subsequently, using the photoresist pattern 209 and the mask layer pattern 208a as an etch mask, the buffer insulating layer 206 is wet etched to form a buffer insulating layer pattern 206a. Thereafter, the photoresist pattern 209 is removed.

In contrast with the conventional method, in the present embodiment, nitride layer etching equipment or wet etching is used to etch the mask layer 208 and the buffer insulating layer 206 instead of using polysilicon layer etching equipment and HBr and Cl gases having a high etch selectivity with respect to an oxide layer. Therefore, the buffer insulating layer 206 can be precisely etched without generating oxide etch residues.

The active region of the silicon substrate 200 and a surface portion of the isolation insulating layer 204 are exposed by the mask layer pattern 208a and the buffer insulating layer pattern 206a. The recess channel trench will be formed in the exposed portion later.

Figure 12A:
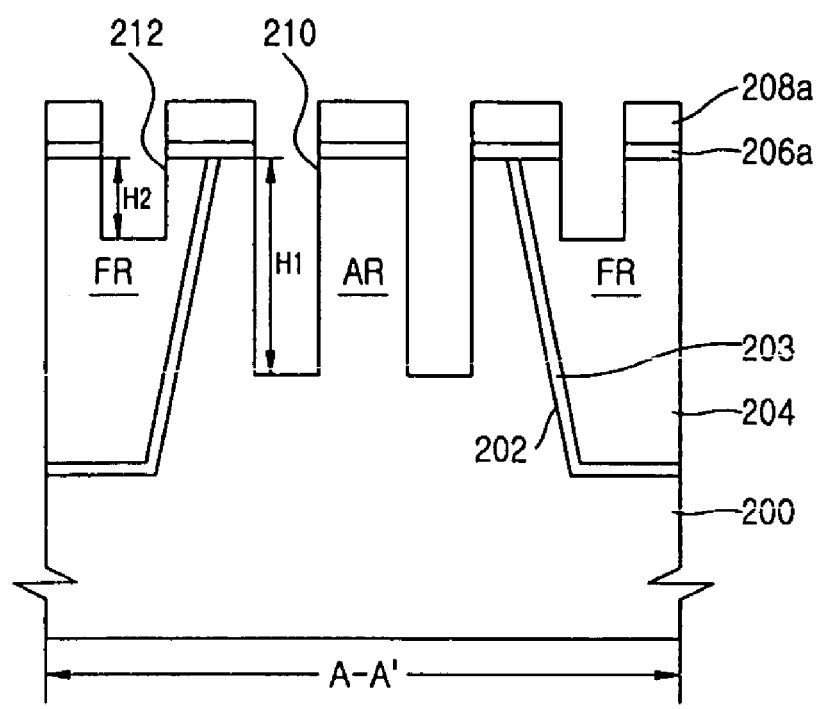
Figure 12B:
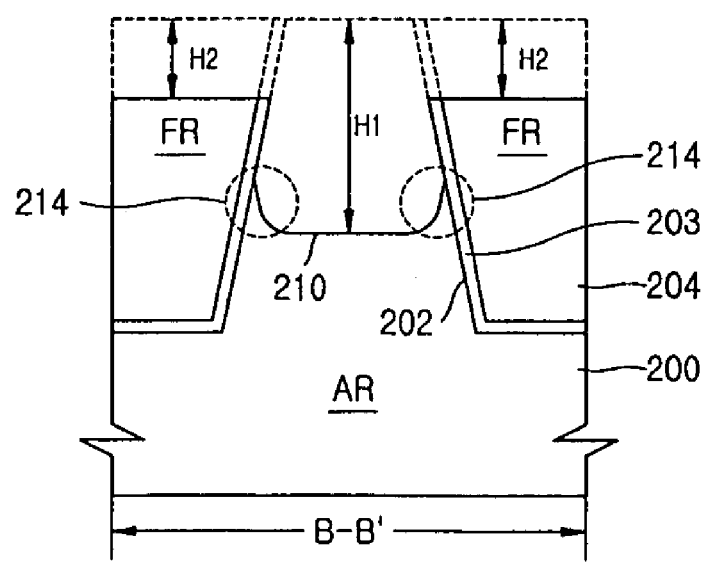

Referring to FIGS. 12A and 12B, the silicon substrate 200 and the isolation insulating layer 204 are etched, using the mask layer pattern 208a and the buffer insulating layer pattern 206a as an etch mask, thereby forming recess channel trenches 210 and 212. The mask layer pattern 208a is partially removed while the silicon substrate 200 and the isolation insulating layer 204 are etched. When the mask layer pattern 208a is formed to a thickness of 600 Å, a thickness of the remaining mask layer pattern 208a may be about 200 Å. The silicon substrate 200 and the isolation insulating layer 204 are plasma etched by polysilicon etching equipment using a combination of, for example, Ar, $CF_4$, $Cl_2$ and HBr gases.

The silicon substrate 200 is etched using the mask layer pattern 208a having a high etch selectivity with respect to the silicon (silicon substrate 200) as an etch mask when forming the recess channel trenches 210 and 212. Accordingly, the recess channel trench 210 formed in the active region AR of the silicon substrate 200 can be adequately controlled to a depth H1. A detailed description of this process will be described later. Since the etch selectivity of the mask layer pattern 208a is high with respect to the isolation insulating layer 204 when forming the recess channel trenches 210 and 212, a depth H2 of the recess channel trench 212 formed in the isolation insulating layer 204 is shallower than the depth H1 of the recess channel trench 212 formed in the silicon substrate 200.

Since the etching for forming the recess channel trenches 210 and 212 is performed using the trench 202 with the a positive slope as a boundary, silicon fences 214 can be formed at both bottom corners of the recess channel trench 210 as shown in FIG. 12B. In other words, as indicated by the broken-lined circle, the silicon substrate 200 partially remains between the sidewalls of the trench 202 and the recess channel trench 210. The silicon fences 214 are also formed if the polysilicon mask layer pattern is used when forming the recess channel trench in accordance with the conventional method.

Figure 13A:
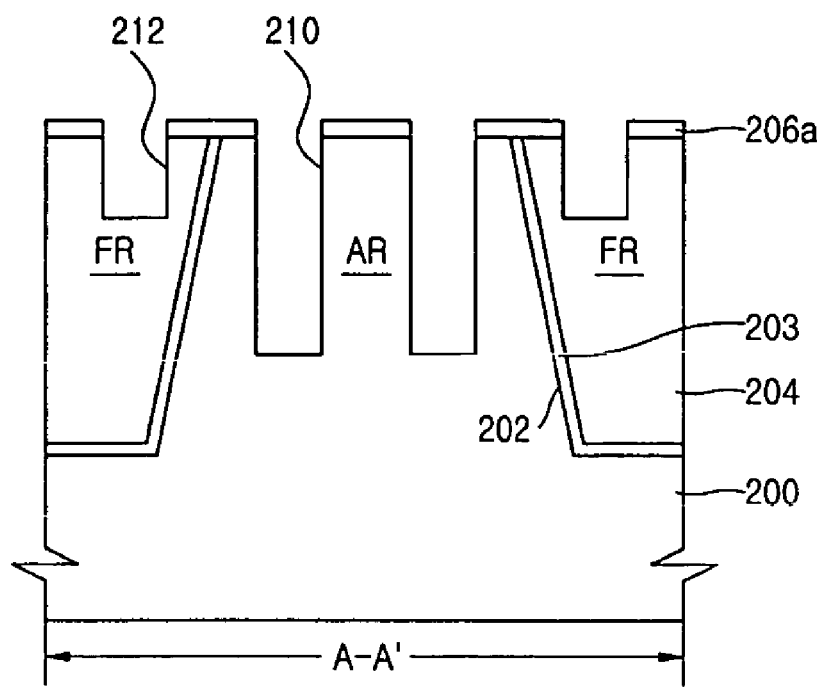
Figure 13B:
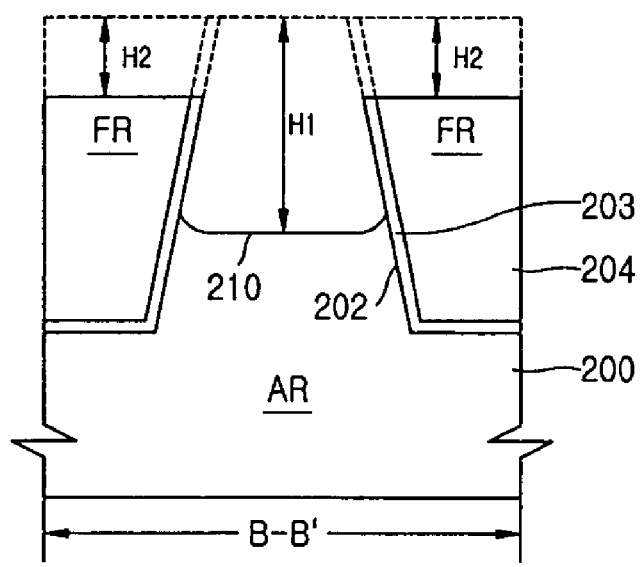

Referring to FIGS. 13A and 13B, the mask layer pattern 208a can be removed via chemical dry etching or wet etching. The chemical dry etching is plasma etching using $CF_4$, $O_2$, $N_2$ and HF gases. Because the chemical dry etching or wet etching is isotropic, the recess channel trenches 210 and 212 can be further deepened.

When the mask layer pattern 208a is removed, the silicon fences 214 can be simultaneously removed, as shown in FIG. 13B. Therefore, in the present embodiment, the silicon fence 214 can be removed without performing an additional fabricating process. When etching the mask layer pattern 208a, the buffer insulating layer pattern 206a remains intact. The remaining buffer insulating layer pattern 206a protects the active region AR of the silicon substrate 200.

Figure 14A:
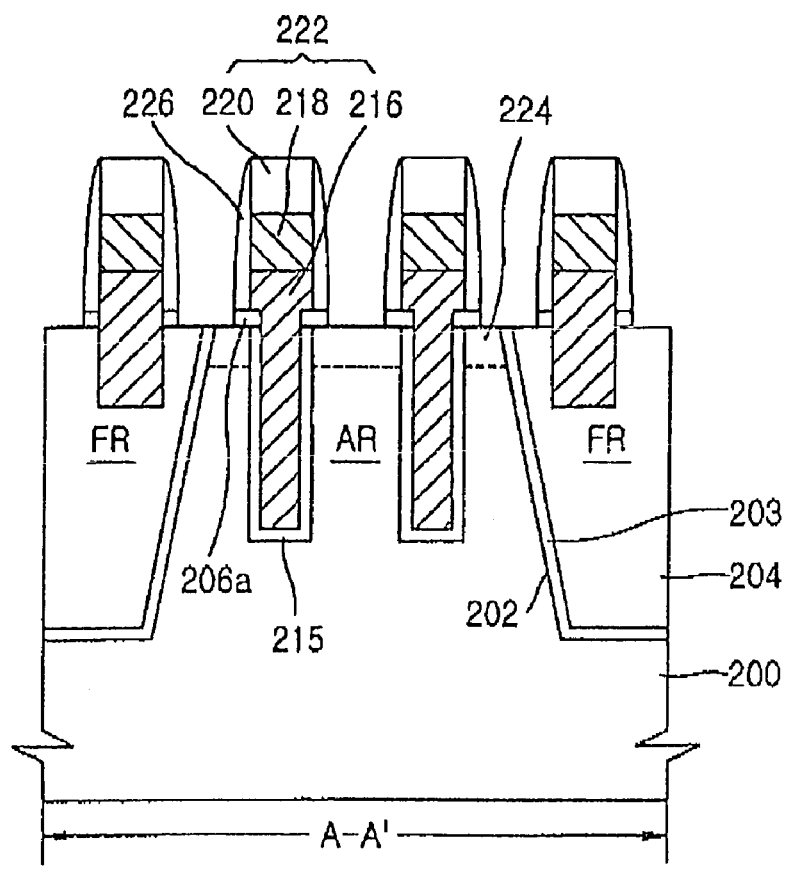
Figure 14B:
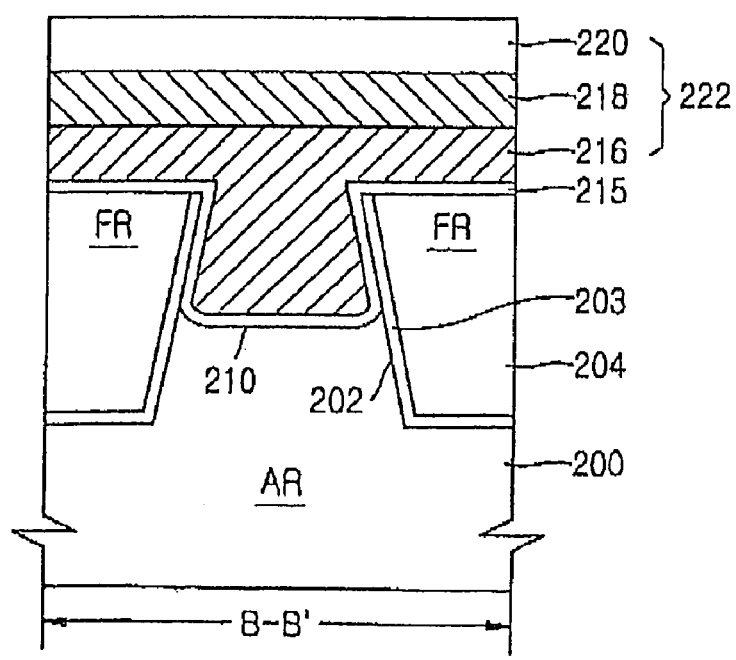

Referring to FIGS. 14A and 14B, a gate insulating layer 215 is formed along the inner walls of the recess channel trench 210. Subsequently, a recess gate stack 222 including a polysilicon layer 216 that fills the recess channel trenches 210 and 212, a gate metal layer 218, which comprises for example, WSi and a capping layer 220, is formed. The polysilicon layer 216 and the gate metal layer 218 form a gate conductive layer. Thereafter, a source and a drain 224 are formed in the upper region of the silicon substrate 200 adjacent to both sidewalls of the recess gate stack 222. Spacers 226 can be formed on both sidewalls of the recess gate stack 222, thereby completing the recess channel array transistor.

In the method of fabricating the recess channel array transistor according to the present embodiment, the depths of the recess channel trenches 210 and 212 can be adjusted and etching uniformity of the silicon substrate can be secured in the process of forming the recess channel trenches 210 and 212 described with reference to FIGS. 12A and 12B. In this regard, the forming of the recess channel trenches 210 and 212 in the silicon substrate 200 will be described in more detail with reference to FIGS. 15 and 16.

Figure 15:
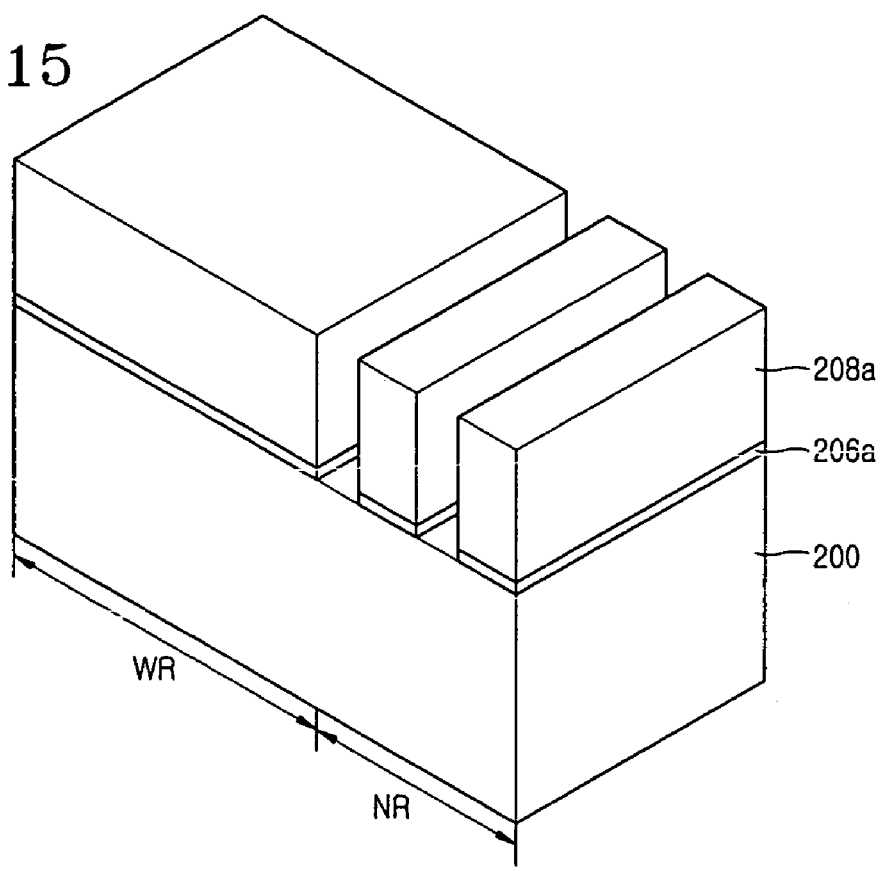
FIGS. 15 and 16 are perspective views illustrating the forming of the recess channel trench shown in FIGS. 12A and 12B.
Figure 16:
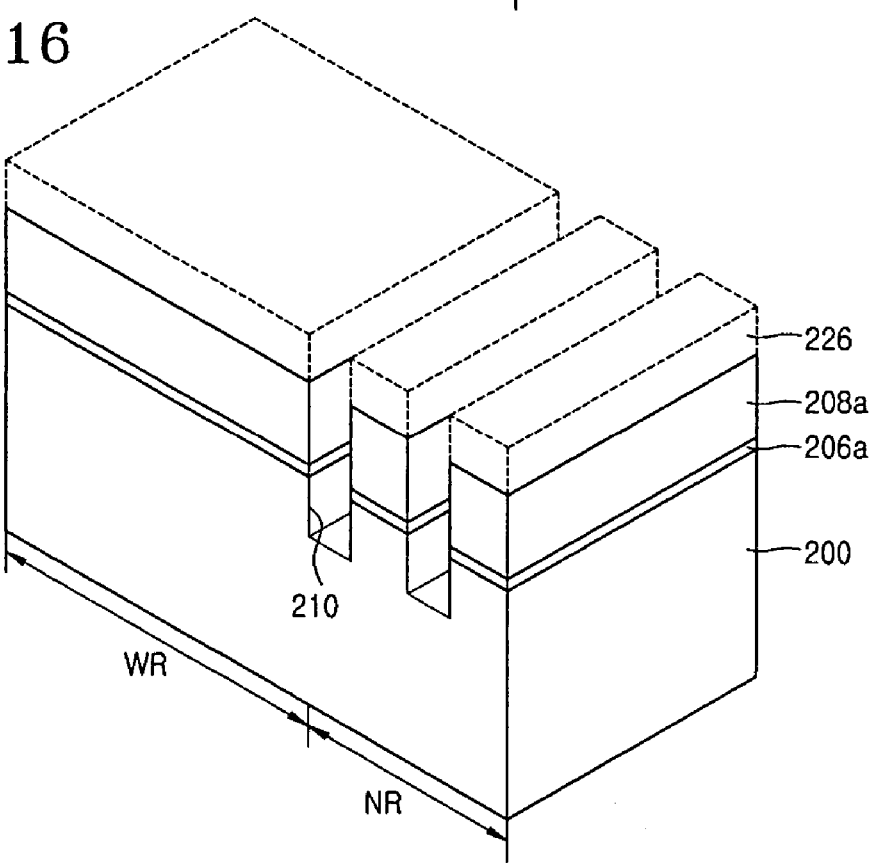

FIGS. 15 and 16 are perspective views illustrating the forming of the recess channel trenches shown in FIGS. 12A and 12B. Like reference numerals in FIGS. 15 and 16 and FIGS. 12A and 12B denote like elements.

Referring to FIG. 15, the buffer insulating layer pattern 206*a* and the mask layer pattern 208*a* are formed on the silicon substrate 200. A height of the mask layer pattern 208*a* is equal to the height as shown in FIG. 11A. The silicon substrate 200 is exposed through the buffer insulating layer pattern 206*a* and the mask layer pattern 208*a*. The recess channel trenches 210 and 212 (FIG. 17) are subsequently formed in the exposed portion of the silicon substrate 200. The portion in which the recess channel trenches 210 and 212 is formed is a narrow region NR, e.g., a cell region. A portion in which the recess channel trenches 210 and 212 is not formed is a wide region WR.

Referring to FIG. 16, the silicon substrate 200 is etched using the mask layer pattern 208*a* and the buffer insulating layer pattern 206*a* as an etch mask, thereby forming the recess channel trench 210 in the narrow region NR. Because the silicon substrate 200 is etched using the mask layer pattern 208*a* having a high etch selectivity with respect to the silicon (silicon substrate 200) as an etch mask, a portion indicated by a reference numeral 226 is etched while a portion of the mask layer pattern 208*a* with a lowered height remains on the silicon substrate 200.

Since a portion of the mask layer pattern 208*a* remains, the buffer insulating layer pattern 206*a* over the wide region WR is not exposed when the recess channel trench 210 is formed in the narrow region NR. Accordingly, the ambient in an etching chamber can remain substantially the same, i.e., unchanged. Therefore, the plasma etching gas does not concentrate on the recess channel trench 210 formed in the narrow region NR, thereby allowing good control of the depth of the recess channel trench 210 and good etching uniformity of the silicon substrate 200.

That is, because the mask layer pattern 208*a* having a high etch selectivity with respect to the silicon can be used, a portion of the mask layer pattern 208*a* remains regardless of the depth to which the recess channel trench 210 is etched. Consequently, the ambient in the etching chamber is unchanged, allowing easy control of the depth of the recess channel trench. Also, the etching uniformity of the silicon substrate 200 is good.

Figure 17:
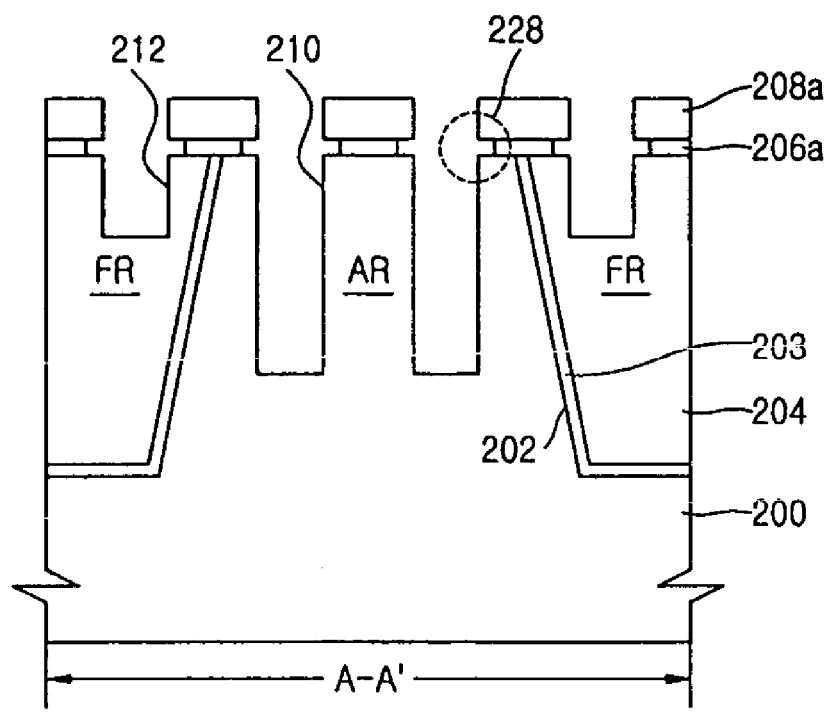
FIGS. 17 and 18 are cross-sectional views illustrating a method of fabricating a recess array channel transistor according to a second embodiment of the present invention.
Figure 18:
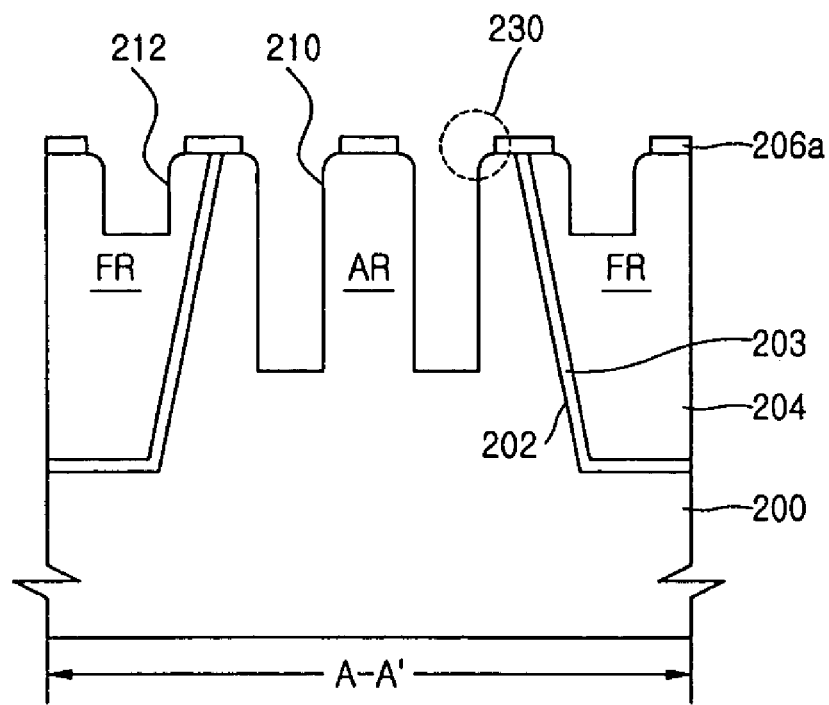

FIGS. 17 and 18 are cross-sectional views illustrating a method of fabricating a recess array channel transistor according to another embodiment of the invention. FIGS. 17 and 18 are cross-sectional views, taken along line A-A' of FIG. 9.

The method of fabricating the recess array channel transistor according to another embodiment of the invention is similar to that of the above-described embodiment except that an upper corner of the recess channel trench 210 is rounded. Like reference numerals in the second embodiment and the first embodiment denote like elements.

The operations illustrated in FIGS. 10 through 11 or 12 are performed. Subsequently, referring to FIG. 17, the buffer insulating layer pattern 206*a* is etched in such a way that a lateral recess is formed below mask layer pattern 208*a* as indicated by a circle 228. Thus, a width of the buffer insulating layer pattern 206*a* is less than a width of the mask layer pattern 208*a*. The buffer insulating layer pattern 206*a* is etched using an HF solution.

Referring to FIG. 18, the recess channel trench 210 is formed as described above when the processing steps illustrated in FIGS. 11A and 11B are performed. Then, the mask layer pattern 208*a* is preferably removed by chemical dry etching or wet etching.

By doing so, an upper corner of the recess channel trench 210 becomes rounded, as indicated by a circle 230, after forming the recess channel trench 210 or removing the mask layer pattern 208*a*. Because the upper corner of the recess channel trench 210 is rounded, an electric field concentrated on the upper corner of the trench 210 is reduced, thereby improving a leakage current characteristic and refresh characteristics of the transistor.

Thereafter, the process illustrated with reference to FIGS. 14A and 14B is performed, thereby completing the formation of the recess channel array transistor.

Figure 19A:
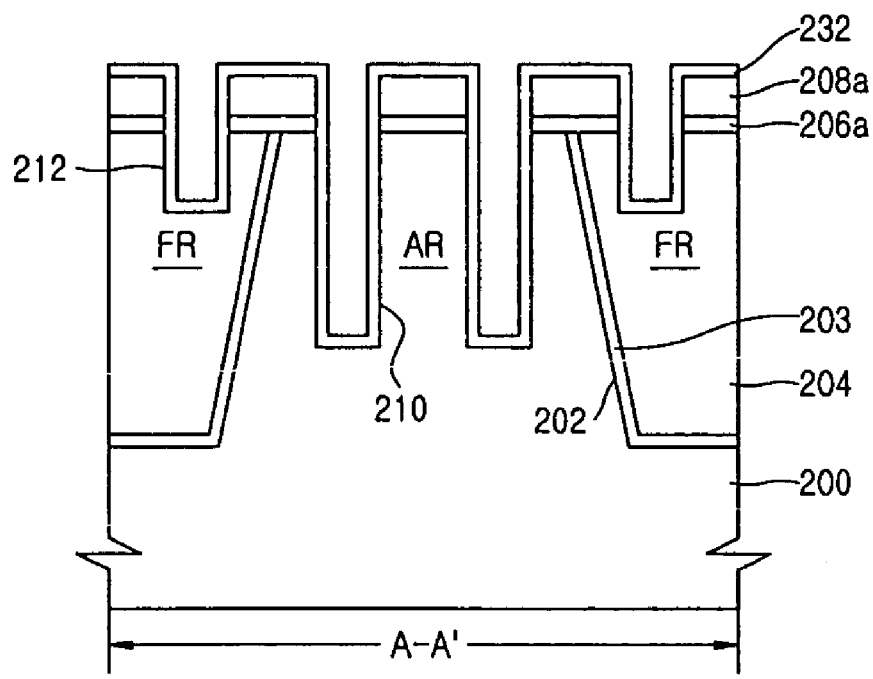
FIGS. 19A and 19B are cross-sectional views illustrating a method of fabricating a recess array channel transistor according to a third embodiment of the present invention.
Figure 19B:
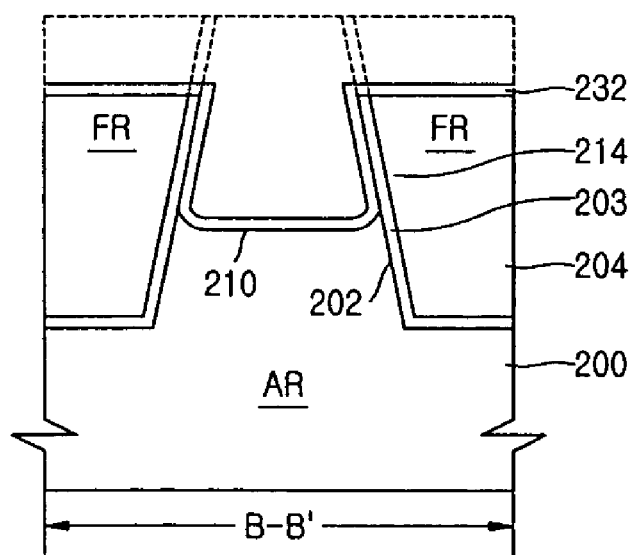

FIGS. 19A and 19B are cross-sectional views illustrating a method of fabricating a recess array channel transistor according to a yet another embodiment of the invention. FIGS. 19A and 19B are cross-sectional views, taken along lines A-A' and B-B' of FIG. 9, respectively.

The method of fabricating the recess array channel transistor according to the third embodiment of the invention is similar to that of the first embodiment except that a sacrificial insulating layer 232 is formed after the recess channel trenches 210 and 212 are formed. Like reference numerals in the third embodiment and the first embodiment denote like elements.

The processing steps illustrated in FIGS. 10 through 12 are performed. Subsequently, referring to FIGS. 19A and 19B, a sacrificial insulating layer 232 is formed on the entire surface of the resultant structure. The sacrificial insulating layer 232 is an oxide layer which protects the liner layer 203 from damage by phosphoric acid used for removing the mask layer pattern 208*a* during a subsequent process.

Then, the processes illustrated in FIGS. 13A and 13B, and FIGS. 14A and 14B are performed, thereby completing the recess channel array transistor.

In the method of fabricating the recess channel array transistor according to an embodiment of the present invention as described above, a mask layer highly selective to silicon (silicon substrate) is used. Therefore, the ambient in an etching chamber is substantially unchanged even when a recess channel trench is etched to a target depth, thereby enabling easy control of a depth of the recess channel trench and good etching uniformity of the silicon substrate.

Furthermore, when a mask layer pattern is composed of SiON or $Si_xN_y$, the remaining portion of the mask layer pattern can be removed when removing silicon fences after forming the recess channel trench, thus requiring no additional process.

Moreover, photolithography for forming the recess channel trench is simplified by using the mask layer as an anti-reflection layer.

Also, because the mask layer and the buffer insulating layer are etched by means of nitride layer etching equipment, the buffer insulating layer can be precisely etched without leaving oxide residues.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of fabricating a recess channel array transistor, the method comprising:
   filling a trench formed in a silicon substrate with an isolation insulating layer, thereby defining an active region;
   forming a buffer insulating layer on the silicon substrate;
   forming a mask layer on the buffer insulating layer, the mask layer having a high etch selectivity with respect to the silicon substrate;
   selectively etching the mask layer and the buffer insulating layer, thereby forming a mask layer pattern and a buffer insulating layer pattern to expose a portion of the active region;
   etching the exposed portion of the silicon substrate in the active region, using the mask layer pattern and the buffer insulating layer pattern as a mask, to form a recess channel trench in the active region, the recess channel trench having a negative slope sidewall;
   removing the mask layer pattern;
   forming a gate insulating layer and a recess gate stack on the recess channel trench; and
   forming a source and a drain in the silicon substrate adjacent to sidewalls of the recess gate stack.

2. The method of claim 1, wherein the mask layer is a silicon nitride layer.

3. The method of claim 1, wherein the mask layer is an SiON layer.

4. The method of claim 1, wherein, when etching the recess channel trench, the etch selectivity ratio of the mask layer pattern with respect to the silicon substrate is about 3:1.

5. The method of claim 1, wherein forming the mask layer pattern and the buffer insulating layer pattern comprises:
   forming a photoresist pattern on the mask layer; and
   selectively etching the mask layer and the buffer insulating layer using the photoresist pattern as a mask.

6. The method of claim 1, wherein forming the mask layer pattern and the buffer insulating layer pattern comprises:
   forming a photoresist pattern on the mask layer;
   selectively etching the mask layer using the photoresist pattern as a mask to form the mask layer pattern;
   wet etching the buffer insulating layer, using the photoresist pattern and the mask layer pattern as an etch mask, to form the buffer insulating layer pattern; and
   removing the photoresist pattern.

7. The method of claim 1, wherein forming the recess gate stack comprises:
   forming the gate insulating layer along an inner wall of the recess channel trench;
   sequentially forming a gate conductive layer filling the recess channel trench and a capping layer on the gate insulating layer; and
   patterning the gate conductive layer and the capping layer to form the recess gate stack.

8. A method of fabricating a recess channel array transistor, the method comprising:
   filling a trench formed in a silicon substrate with an isolation insulating layer, thereby defining an active region;
   forming a buffer insulating layer on the silicon substrate and the isolation insulating layer;
   forming a mask layer on the buffer insulating layer, the mask layer having a high etch selectivity with respect to the silicon substrate;
   forming a mask layer pattern and a buffer insulating layer pattern by selectively etching the mask layer and the buffer insulating layer to expose a portion of active region and a portion of the isolation insulating layer;
   etching the exposed portion of the silicon substrate in the active region and the exposed portion of the isolation insulating layer while substantially partially removing the mask layer pattern to form a recess channel trench;
   removing a remaining portion of the mask layer pattern;
   forming a gate insulating layer and a recess gate stack on the recess channel trench;
   forming a source and a drain in the silicon substrate adjacent to both sidewalls of the recess gate stack; and
   removing silicon fences formed on sidewalls of the recess channel trench while removing the remaining portion of the mask layer pattern, wherein the mask layer pattern and the silicon fences are removed by chemical dry etching or wet etching.

9. The method of claim 8, wherein the mask layer is a silicon nitride layer.

10. The method of claim 8, wherein the mask layer is an SiON layer or an $Si_xN_y$ layer.

11. The method of claim 8, wherein, when etching the recess channel trench, the etch selectivity ratio of the mask layer pattern with respect to the silicon substrate is about 3:1.

12. The method of claim 8, wherein the chemical dry etching is plasma etching using a gas containing $CF_4$, $O_2$, $N_2$, and HF gases.

13. The method of claim 8, wherein the wet etching uses a phosphoric acid solution as an etchant.

14. The method of claim 8, wherein, during the removal of the mask layer and the silicon fences, the buffer insulating layer pattern is not substantially removed.

15. A method of fabricating a recess channel array transistor comprising:
   filling a trench of a silicon substrate with an isolation insulating layer to define an active region;
   forming a buffer insulating layer on the silicon substrate;
   forming a mask layer on the buffer insulating layer, the mask layer having a high etch selectivity with respect to the silicon substrate;
   forming a mask layer pattern and a buffer insulating layer pattern by selectively etching the mask layer and the buffer insulating layer to expose a portion of active region and a portion of the isolation insulating layer;
   wet etching the buffer insulating layer pattern to form a recessed portion directly underneath the mask layer pattern;
   etching the exposed portion of the silicon substrate in the active region, using the mask layer pattern and the buffer insulating layer pattern as a mask, to form a recess channel trench with an upper corner rounded;
   removing the mask layer pattern;
   forming a gate insulating layer and a recess gate stack on the recess channel trench; and forming a source and a drain in the silicon substrate adjacent to both sidewalls of the recess gate stack.

16. The method of claim 15, wherein a hydrofluoric acid solution is used as an etchant in wet etching the buffer insulating layer pattern.

17. The method of claim 15, wherein the mask layer is a silicon nitride layer.

18. A method of fabricating a recess channel array transistor, the method comprising:
   forming an isolation insulating layer by filling a trench of a silicon substrate to define an active region;
   forming a buffer insulating layer on the silicon substrate;
   forming a mask layer on the buffer insulating layer, the mask layer having a high etch selectivity with respect to the silicon substrate;
   forming a mask layer pattern and a buffer insulating layer pattern;
   selectively etching the mask layer and the buffer insulating layer to expose a portion of the active region;
   etching the exposed portion of the silicon substrate in the active region, using the mask layer pattern and the buffer insulating layer pattern as a mask, to form a recess channel trench;
   wet etching the buffer insulating layer pattern to form a recessed portion directly underneath the mask layer pattern;
   removing the mask layer pattern, and concurrently rounding an upper corner of the recess channel trench;
   forming a gate insulating layer and a recess gate stack on the recess channel trench; and
   forming a source and a drain in the silicon substrate adjacent to both sidewalls of the recess gate stack.

19. The method of claim 18, wherein a hydrofluoric acid solution is used as an etchant in the wet etching the buffer insulating layer pattern.

20. The method of claim 18, wherein the mask layer is a silicon nitride layer.

21. A method of fabricating a recess channel array transistor comprising:
   forming a trench in a silicon substrate;
   forming a liner layer along an inner wall of the trench;
   defining an active region in the silicon substrate by filling the trench with an isolation insulating layer;
   forming a buffer insulating layer on the silicon substrate and the isolation insulating layer;
   forming a mask layer on the buffer insulating layer, the mask layer having a high etch selectivity with respect to the silicon substrate;
   forming a mask layer pattern and a buffer insulating layer pattern;
   selectively etching the mask layer and the buffer insulating layer to expose a portion of the active region and a portion of the isolation insulating layer;
   etching the exposed portion of the silicon substrate in the active region and the exposed portion of the isolation insulating layer without removing substantially all of the mask layer pattern to form a recess channel trench;
   shielding the liner layer by forming a sacrificial insulating layer on the silicon substrate, the isolation insulating layer, the mask layer pattern and the buffer insulating layer pattern;
   removing the remaining portion of the mask layer pattern, and concurrently removing silicon fences formed on sidewalls of the trench;
   forming a gate insulating layer and a recess gate stack on the recess channel trench; and
   forming a source and a drain in the silicon substrate adjacent to both sidewalls of the recess gate stack.

22. The method of claim 21, wherein the liner layer is a silicon nitride layer.

23. The method of claim 21, wherein a phosphoric acid solution is used as an etchant to remove the mask layer pattern and the silicon fences.

24. The method of claim 21, wherein the mask layer is a silicon nitride layer.

* * * * *